(12) United States Patent
Moallem et al.

(10) Patent No.: US 11,258,161 B2
(45) Date of Patent: Feb. 22, 2022

(54) ANTENNA-ON-PACKAGE INTEGRATED CIRCUIT DEVICE

(71) Applicant: TEXAS INSTRUMENTS INCORPORATED, Dallas, TX (US)

(72) Inventors: Meysam Moallem, Plano, TX (US); Ross Allan Kulak, Fort Worth, TX (US)

(73) Assignee: Texas Instmments Incorporated, Dallas, TX (US)

( * ) Notice: Subject to any disclaimer, the term of this patent is extended or adjusted under 35 U.S.C. 154(b) by 149 days.

(21) Appl. No.: 16/559,019

(22) Filed: Sep. 3, 2019

(65) Prior Publication Data
US 2020/0259239 A1   Aug. 13, 2020

Related U.S. Application Data

(60) Provisional application No. 62/803,156, filed on Feb. 8, 2019.

(51) Int. Cl.
*H01Q 1/22*  (2006.01)
*H01Q 1/48*  (2006.01)
(Continued)

(52) U.S. Cl.
CPC ....... *H01Q 1/2283* (2013.01); *H01L 23/3128* (2013.01); *H01L 23/5383* (2013.01);
(Continued)

(58) Field of Classification Search
CPC ...... H01Q 1/2283; H01Q 1/38; H01Q 9/0407; H01Q 1/48; H01Q 21/065; H01P 3/08; G01S 7/028; G01S 7/032; G01S 13/931; H01C 21/065; H01C 1/48; H01L 23/49838; H01L 23/49816; H01L 23/49827; H01L 23/49822; H01L 23/3128; H01L 23/5383;
(Continued)

(56) References Cited

U.S. PATENT DOCUMENTS 5,382,959 A * 1/1995 Patt ................ H01Q 21/065
343/700 MS
6,130,640 A  10/2000 Uematsu et al.
(Continued)

FOREIGN PATENT DOCUMENTS

WO  20180046884  1/2018

OTHER PUBLICATIONS

International Search Report for PCT/US2020/0017243 dated Apr. 30, 2020.

*Primary Examiner* — Renan Luque
(74) *Attorney, Agent, or Firm* — Brian D Graham; Charles A. Brill; Frank D. Cimino

(57) ABSTRACT

An integrated circuit package is provided. In some examples, the integrated circuit package is an antenna-on-package package that includes a plurality of dielectric layers, a plurality of conductor layers interspersed with the plurality of dielectric layers, and an integrated circuit die disposed on a first side of the plurality of dielectric layers. The plurality of conductor layers includes a first layer disposed on a second side of the plurality of dielectric layers that includes a set of antennas. In some such examples, the integrated circuit die includes radar processing circuitry, and the AOP integrated circuit package is configured for radar applications.

20 Claims, 15 Drawing Sheets

(51) Int. Cl.
  *H01L 23/31* (2006.01)
  *H01L 23/538* (2006.01)
  *H01L 23/66* (2006.01)
  *H01P 3/08* (2006.01)

(52) U.S. Cl.
  CPC ...... *H01L 23/5386* (2013.01); *H01L 23/5389* (2013.01); *H01L 23/66* (2013.01); *H01P 3/08* (2013.01); *H01Q 1/48* (2013.01); *H01L 2223/6627* (2013.01); *H01L 2223/6677* (2013.01); *H01L 2223/6683* (2013.01)

(58) Field of Classification Search
  CPC . H01L 23/5386; H01L 23/66; H01L 23/5389; H01L 2223/6683; H01L 2223/6627; H01L 2223/6677; H01L 2224/73204; H01L 2224/32225; H01L 2224/16225
  See application file for complete search history.

(56) References Cited

U.S. PATENT DOCUMENTS

| | | |
|---|---|---|
| 9,589,917 B1 | 3/2017 | Rodriguez et al. |
| 2013/0027269 A1* | 1/2013 | Orime .................... H01Q 1/521 |
| | | 343/841 |
| 2015/0270616 A1 | 9/2015 | Jafarlou et al. |
| 2015/0325925 A1 | 11/2015 | Kamgaing et al. |
| 2016/0049723 A1* | 2/2016 | Baks .................... H01Q 1/2291 |
| | | 343/848 |

* cited by examiner

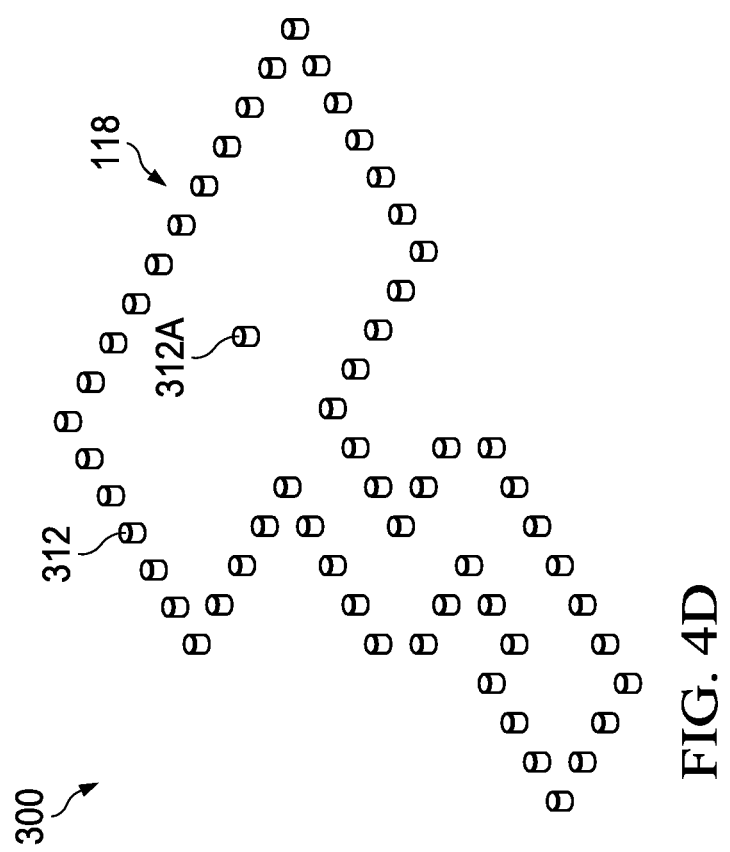

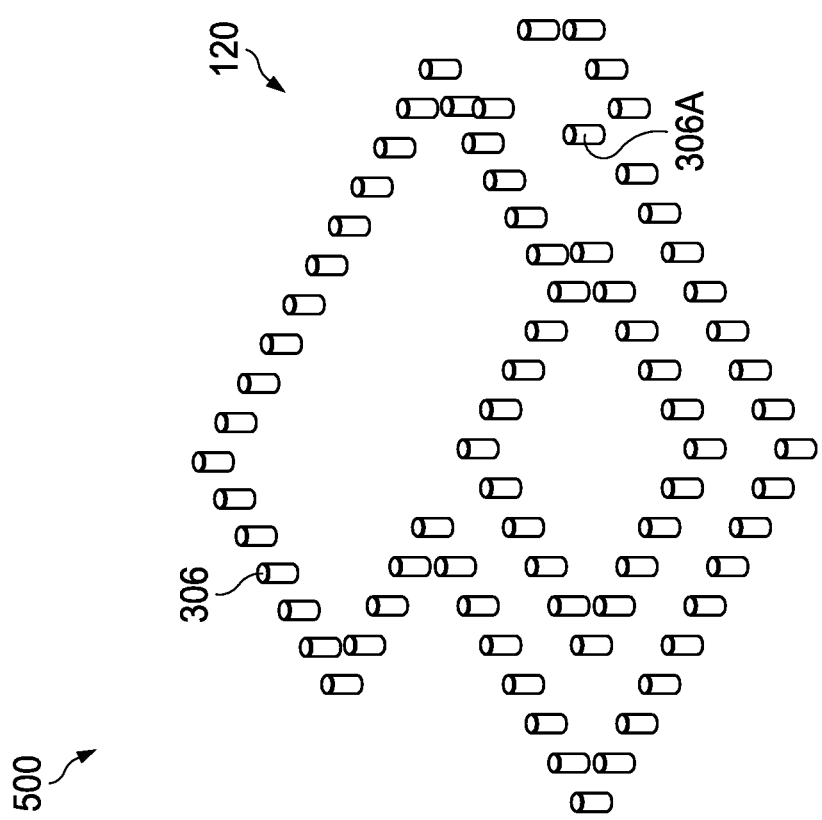

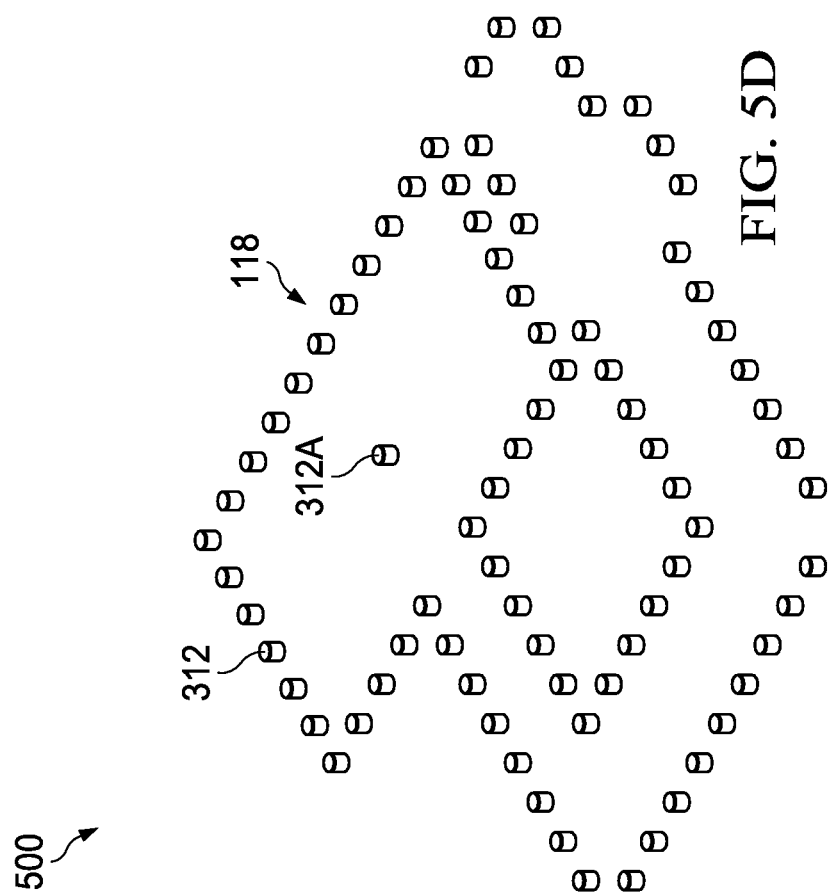

ANTENNA-ON-PACKAGE INTEGRATED CIRCUIT DEVICE

CROSS-REFERENCE TO RELATED APPLICATIONS

This application claims the benefit of and priority to U.S. Provisional Application No. 62/803,156 to Meysam Moallem et al., filed on Feb. 8, 2019, the entire disclosure of which is hereby incorporated by reference.

BACKGROUND

Large-scale radar systems are used for tracking aircraft, forecasting weather, studying geological formations, observing planets, and other long-range applications. Such systems are often large and powerful. At the same time, rapid advances in signal processing and semiconductor fabrication have allowed radar systems to be miniaturized. These low-power, low-cost radar systems have opened the door to a wide variety of applications including self-driving cars, automated material-handling systems, collision avoidance, and other applications.

A radar system senses distant objects by emitting electromagnetic waves using one or more transmitter antennas and receiving reflections of the electromagnetic waves using one or more receiver antennas. Control of the transmitted signals and processing of the received signals may be performed by a number of active and passive integrated circuit devices on one or more integrated circuit dies. In turn, the dies and devices may be incorporated into one or more semiconductor packages. A semiconductor package surrounds and protects the incorporated integrated circuit dies and/or devices. The package may include layers of rigid insulating material and layers of conductive material that extend through the insulating material to connect the dies and devices to each other and to the remainder of the system.

SUMMARY

In some examples, a Monolithic Microwave Integrated Circuit (MMIC) package is provided that includes an integrated circuit die, a set of transmitter antennas, and a set of receiver antennas. Accordingly, the MMIC package may be referred to as an Antenna-On-Package (AOP) radar device.

In some examples, an integrated circuit package includes a plurality of dielectric layers and an integrated circuit die disposed on a first side of the plurality of dielectric layers. A plurality of conductor layers are interspersed with the plurality of dielectric layers, which include a first layer disposed on a second side of the plurality of dielectric layers opposite the first side. The first layer includes a set of antennas electrically coupled to the integrated circuit die. In some such examples, a first antenna of the set of antennas has a center portion, a first side portion partially separated from the center portion by a first recess, and a second side portion partially separated from the center portion by the second recess. In some such examples, the antennas are cavity-backed antennas. In some such examples, the set of antennas include at least one transmitter antenna and at least one receiver antenna. In some such examples, the integrated circuit package includes an electromagnetic band gap structure disposed between the at least one transmitter antenna and the at least one receiver antenna. In some such examples, the electromagnetic band gap structure includes a plurality of electrically isolated features of the first layer. In some such examples, the set of antennas include a plurality of transmitter antennas aligned in a first direction, and a plurality of receiver antennas aligned in a second direction that is perpendicular to the first direction. In some such examples, the first direction is at an angle of about 45° relative to side surfaces of the plurality of transmitter antennas; and the second direction is at an angle of about 45° relative to side surfaces of the plurality of receiver antennas. In some such examples, the set of antennas are configured to produce an electromagnetic wave at a center frequency. The plurality of transmitter antennas are arranged at a pitch that is about half a wavelength of the electromagnetic wave, and the plurality of receiver antennas are arranged at the same pitch. In some such examples, a plurality of package connectors is disposed on the first side of the plurality of dielectric layers and are electrically coupled to the integrated circuit die.

In further examples, an integrated circuit package includes an integrated circuit die and a first conductor layer disposed on the integrated circuit die that includes a set of antennas. Each antenna of the set of antennas include a center portion, a first side portion adjacent the center portion, a first recess extending partially through the respective antenna between the center portion and the first portion, a second side portion adjacent the center portion, and a second recess extending partially through the respective antenna between the center portion and the second portion.

In yet further examples, an apparatus includes a plurality of dielectric layers configured to couple to an integrated circuit die on a first side of the plurality of dielectric layers, a plurality of connectors disposed on the first side of the plurality of dielectric layers, a first set of conductive features disposed within the plurality of dielectric layers and configured to electrically couple the integrated circuit die to the plurality of connectors, and a second set of conductive features disposed within the plurality of dielectric layers that includes a plurality of radar antennas configured to electrically couple to the integrated circuit die.

BRIEF DESCRIPTION OF THE DRAWINGS

FIGS. 4A-4E are perspective views of layers of a package that includes a package-integrated antenna according to some aspects of the present disclosure.

FIGS. 5A-5E are perspective views of layers of a package that includes a package-integrated antenna according to some aspects of the present disclosure.

DETAILED DESCRIPTION

Figure 1:
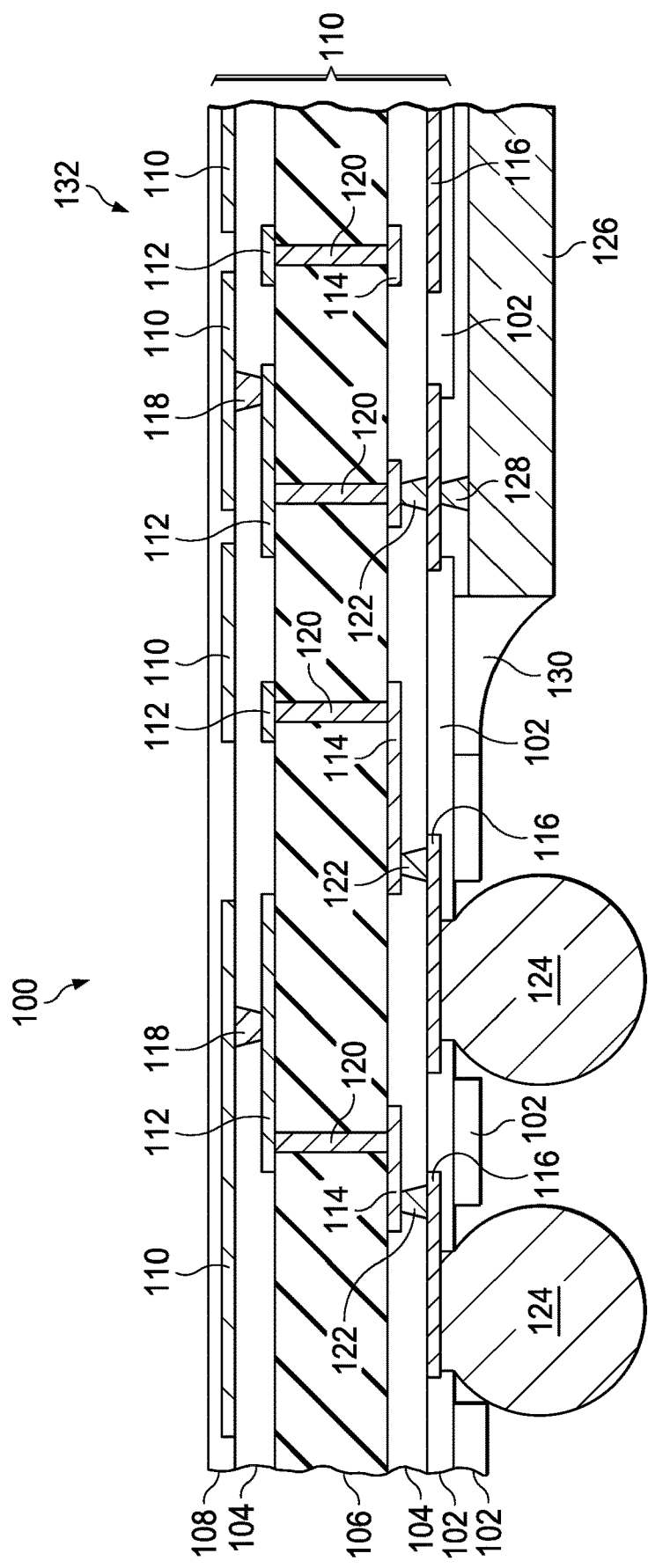
FIG. 1 is a cross sectional view of a portion of an antenna-on-package integrated circuit package according to some aspects of the present disclosure.

Specific examples are described below in detail with reference to the accompanying figures. It is understood that these examples are not intended to be limiting, and unless otherwise noted, no feature is required for any particular example. Moreover, the formation of a first feature over or on a second feature in the description that follows may include examples in which the first and second features are formed in direct contact and examples in which additional features are formed between the first and second features, such that the first and second features are not in direct contact.

In accordance with convention in the art, relative terms that describe orientation, such as "above," "below," "over," "under," "on," etc., are provided for clarity of discussion and are not absolute relationships. For example, a first element that is "above" a second element may be just as accurately described as "below" the second element if the orientation of the device is flipped.

The present disclosure provides a semiconductor package, such as a Monolithic Microwave Integrated Circuit (MMIC) package. The package includes transmitter and receiver radar antennas and an integrated circuit die with radar-processing circuitry. The circuitry may perform various functions such as driving signals that control the transmitter antennas and processing signals received by the receiver antennas. As the name suggests, this type of package that includes antenna along with the control circuitry may be referred to as an Antenna-On-Package (AOP) device. Incorporating the radar antennas into the same package as the control circuitry may avoid many of the challenges of coupling the antennas to an integrated circuit die through a printed circuit board. It may also reduce power loss by improved coupling of signal paths to transmit and receive antennas, resulting in better radar performance (e.g., improved maximum range). It may also greatly reduce the size of the overall radar system and simplify integration of the radar system into a vehicle, factory, facility, or other environment. It may also reduce system power and cost.

In some examples, the dies are attached to an underside of the package near the package connectors in an undermount configuration, while the antennas are formed on a top side of the package. Because the antennas radiate energy through the thinner package top rather than through the bulk of the package, antenna efficiency may be improved and spurious radiation may be reduced. Furthermore, the configuration may reduce the overall package size by allowing antennas to be formed directly on top of the die. As yet a further advantage, this configuration allows the upper conductor levels to be reserved for routing transmission lines to and from the antennas with good isolation and minimal routing loss. It may also leave the lower routing levels for optimal routing of non-radio frequency I/O signals between the package connectors and the die(s). In sum, this configuration may provide high antenna efficiency, small size, and efficient routing.

In some examples, the antennas are cavity-backed antennas shaped and configured to provide good antenna-to-antenna isolation. In some examples, the antennas may have a slotted E-shaped configuration to improve antenna bandwidth, and the slot position and depth may be tuned based on the desired frequency response. The antennas may be arranged in arrays, and in some examples, antennas are rotated 45° within an array to reduce antenna-to-antenna coupling caused by close spacing.

To isolate the receiver antennas from the transmitter antennas, the package may include Electromagnetic Band Gap (EBG) structures between the receiver antennas and the transmitter antennas and along edges of the package that dampen surface waves and spurious radiation.

These advantages are merely provided as examples, and unless otherwise noted, no particular advantage is required for any particular embodiment.

Figure 2:
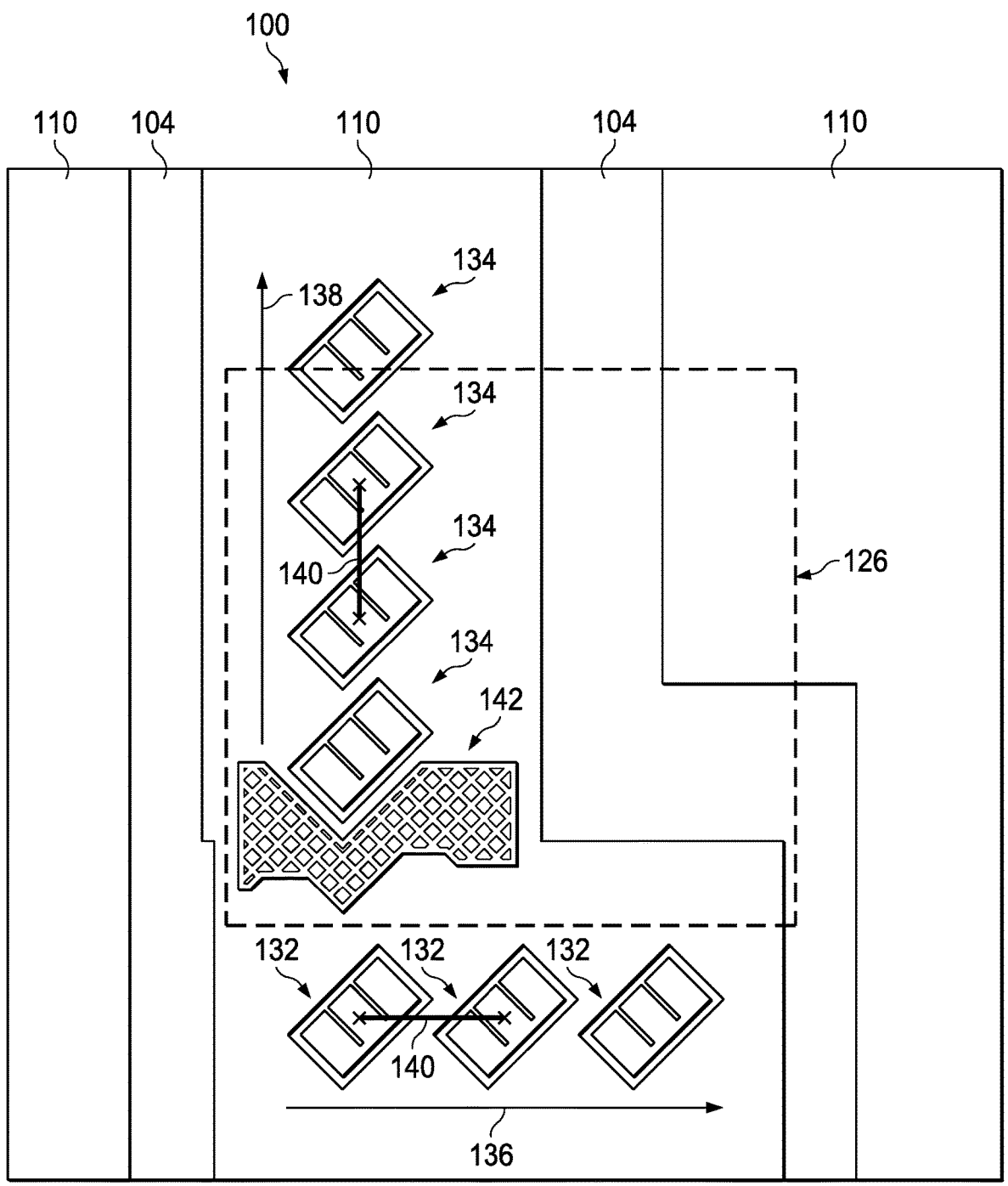
FIG. 2 is a top view of an antenna-on-package integrated circuit package according to some aspects of the present disclosure.

Examples of an AOP integrated circuit package 100 are described with reference to FIGS. 1 and 2. In that regard, FIG. 1 is a cross sectional view of a portion of the AOP integrated circuit package 100 according to some aspects of the present disclosure. FIG. 2 is a top view of the AOP integrated circuit package 100 according to some aspects of the present disclosure.

The package 100 includes one or more dielectric layers that provide physical support for and isolate a network of interconnecting conductors. Examples of dielectric layers include back-side solder resist layers 102, intermediate dielectric layers 104, a core dielectric layer 106, and a front-side solder resist layer 108 disposed opposite the back-side solder resist layers 102.

As they may form the exterior of the package, the front-side solder resist layer 108 and back-side solder resist layers 102 may include dielectric materials selected to be impervious to air and moisture, to provide good crack resistance, and to control solder flow, in addition to providing electrical isolation. The front-side solder resist layer 108 and back-side solder resist layers 102 may also be referred to as solder mask layers. The front-side solder resist layer 108 and the back-side solder resist layers 102 may be formed to any suitable thickness, and in various examples, the front-side solder resist layer 108 and the back-side solder resist layers 102 are between about 5 μm and about 30 μm thick.

The intermediate dielectric layers 104 may include any suitable dielectric materials, and examples include resin laminates. The intermediate dielectric layers 104 may be formed to any suitable thickness and, in various examples, are between about 10 μm and about 50 μm thick.

The core dielectric layer 106 may provide the bulk of the rigidity and may be configured accordingly. In that regard, the core dielectric layer 106 may be thicker than the back-side solder resist layers 102, the intermediate dielectric layers 104, and the front-side solder resist layer 108. In some examples, the core dielectric layer 106 is between about 150 μm and about 250 μm thick. The core dielectric layer 106 may include any suitable dielectric materials, which may be selected, in part, based on resistance to deformation. In various examples, the core dielectric layer 106 includes resin laminates and ceramics.

Conductive traces extend throughout the dielectric layers 102-108 to carry signals and power between the devices of the integrated circuit package 100. The traces may be divided among conductor layers 110-116 that extend primarily horizontally and conductive vias 118-122 that extend primarily vertically. For ease of reference, horizontal conductor layers 110-116 are referred to as M1 layer 110, M2 layer 112, M3 layer 114, and M4 layer 116; and via layers 118-122 are referred to as V1 layer 118, V2 layer 120, and V3 layer 122. The conductive traces within the layers 110-122 may include any suitable conductive material, such as copper, aluminum, gold, silver, nickel, tungsten, and/or alloys thereof. The integrated circuit package 100 may also include package interconnect connectors 124, such as ball grid array connectors, land grid array connectors, pin grid array connectors, and/or surface-mount leads, to carry signals and power between the devices of the integrated circuit package 100 and the remainder of a radar system.

The integrated circuit package 100 may also include a number of integrated circuit dies 126 coupled to the dielectric layers. In turn, each integrated circuit die 126 may include a number of active circuit elements (e.g., bipolar junction transistors, field effect transistors, etc.) and/or passive circuit elements (e.g., resistors, capacitors, inductors, diodes, transformers, etc.) formed on a semiconductor substrate. The circuit elements of the integrated circuit dies 126 may perform operations related to radar sensing such as driving radar transmitter antennas to produce electromagnetic waves and processing signals produced when reflected electromagnetic waves are received by radar receiver antennas.

Within an integrated circuit die 126, the circuit elements are electrically coupled by an electrical interconnect, which may include a number of bond pads 128 for sending and receiving signals off the die 126. To carry these signals beyond the die 126, the bond pads 128 are electrically coupled to the rest of the package 100 during a die attach process by a suitable technique, such as soldering, thermosonic bonding, ultrasonic bonding, epoxy die attach, and/or other suitable techniques.

Many of these techniques also provide a degree of physical coupling as the material (e.g., solder, underfill material) that electrically couples the bond pads 128 also physically couples the top or face of the die 126 to the package. To further secure the die 126 and to prevent intrusion by air and/or moisture, a mold compound 130 may also be applied to the top, sides, and/or bottom of the integrated circuit die 126. A mold compound 130 may include an epoxy resin with one or more fillers, catalysts, flame retardants, adhesion promotors, and/or other additives and may be configured to create a hermetic seal around the die 126. Suitable mold compounds 130 include epoxy cresol novolac (ECN) resins and other types of resins.

The integrated circuit dies 126 may be physically coupled to the remainder of the package 100 in any suitable configuration. For example, the integrated circuit dies 126 may be coupled in an undermount arrangement where the integrated circuit dies 126 are on the same side of the package as the package interconnect connectors 124.

The AOP package 100 may include a number of antennas coupled to the circuitry of the die 126. Examples of transmitter antennas 132 and receiver antennas 134 are shown in the top view of FIG. 2. In this particular view, the front-side solder resist layer 108 is omitted to better illustrate the underlying layers including the M1 layer 110, which is used to form the set of radar transmitter antennas 132 and the set of radar receiver antennas 134. Example structures of the antennas 132 and 134 are described in more detail in subsequent figures.

The integrated circuit package 100 may include any number of radar transmitter antennas 132 and receiver antennas 134 depending on the application. The antennas may be grouped into arrays, and in some examples, the transmitter antennas 132 and receiver antennas 134 are arranged to produce a Multi-Input Multi-Output (MIMO) array. In some such examples, the array of transmitter antennas 132 is aligned in a first direction 136 perpendicular to the set of receiver antennas 134, which is aligned in a second direction 138. This allows beamforming in both the azimuth and elevation planes. Within the array, the transmitter antennas 132 may be spaced apart in the first direction 136 by any suitable amount, and the receiver antennas 134 may be spaced apart in the second direction 138 by any suitable amount. In some examples, the antennas 132 and 134 are configured to emit and receive electromagnetic waves at a set of frequencies and are arranged at a center-to-center pitch 140 that is less than or equal to about half of the wavelength of the electromagnetic waves at the center frequency (e.g., 1.9 mm spacing corresponding to about 79 GHz). This spacing may avoid grating lobes that may otherwise create ambiguity in object detection.

As can be seen, the transmitter antennas 132 and the receiver antennas 134 may be oriented at a 45° angle so that the first direction 136 and the second direction 138 are at about a 45° angle relative to the side surfaces of the antennas 132 and 134. It has been determined that closely arranged antennas in an array may experience antenna-to-antenna mutual coupling that reduces the accuracy of angle-of-arrival (AoA) estimation for a given MIMO array. However, rotating the antennas 132 and 134 so that the arrays of antennas 132 and 134 extend diagonal (e.g., at about 45°) to the side surfaces of the antennas 132 and 134 has been determined to reduce this coupling and thereby provide greater accuracy.

To better isolate the receiver antennas 134 from direct interference by the transmitter antennas 132, the integrated circuit package 100 may also include an Electromagnetic Band Gap (EBG) structure 142. In some examples, the EBG structure 142 is configured to dampen surface waves along the integrated circuit package 100 and other sources of interference. In various examples, the EBG structure 142 has been demonstrated to improve isolation by 6 dB or more. The EBG structure 142 may also be configured to improve the radiation patterns of the antennas 132 and 134. The EBG structure 142 may include a number of conductive features in the conductor layers 110-122, and example configurations are described in more detail below.

Figure 3:
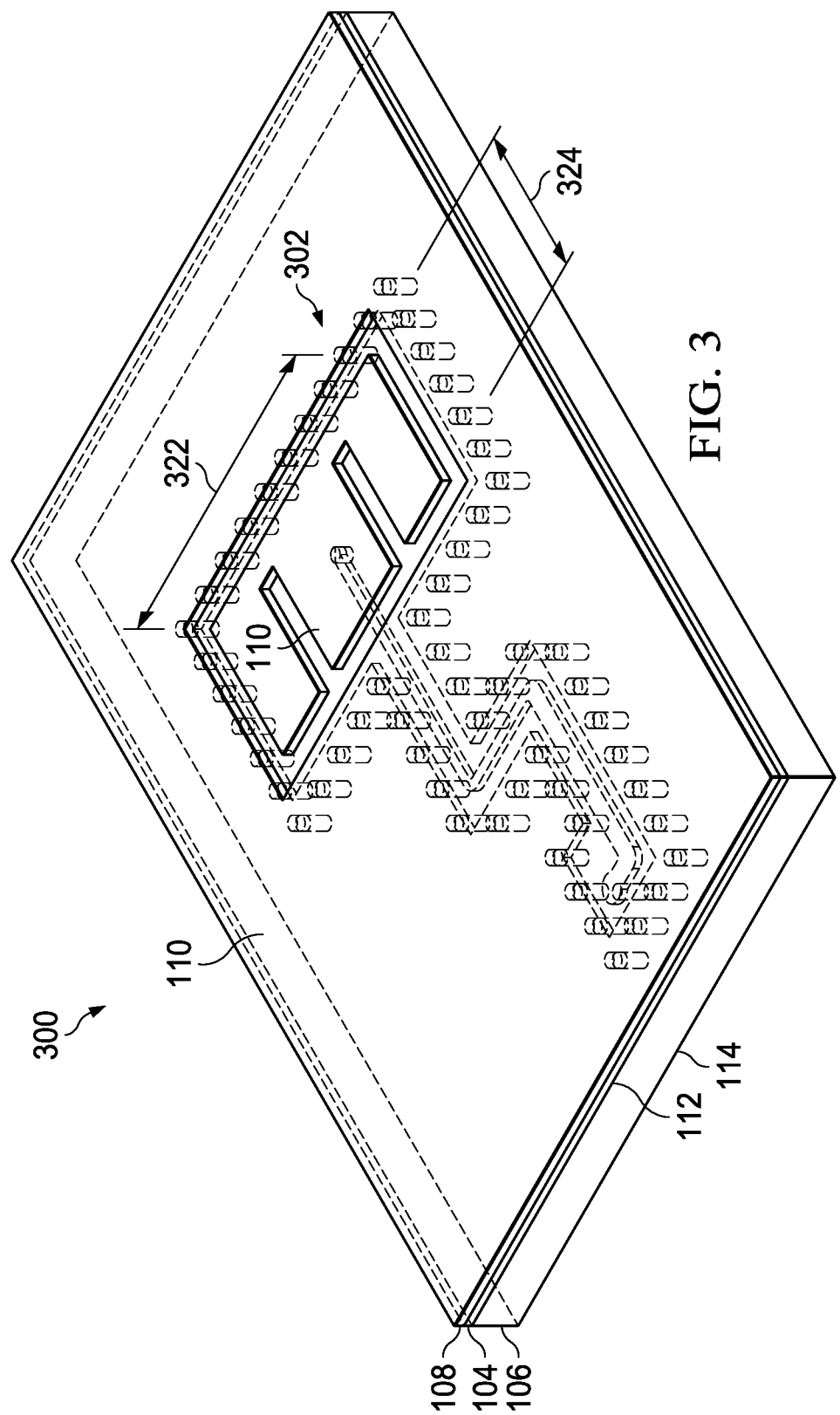
FIG. 3 is a perspective view of a package that includes a package-integrated antenna according to some aspects of the present disclosure.
Figure 4A:
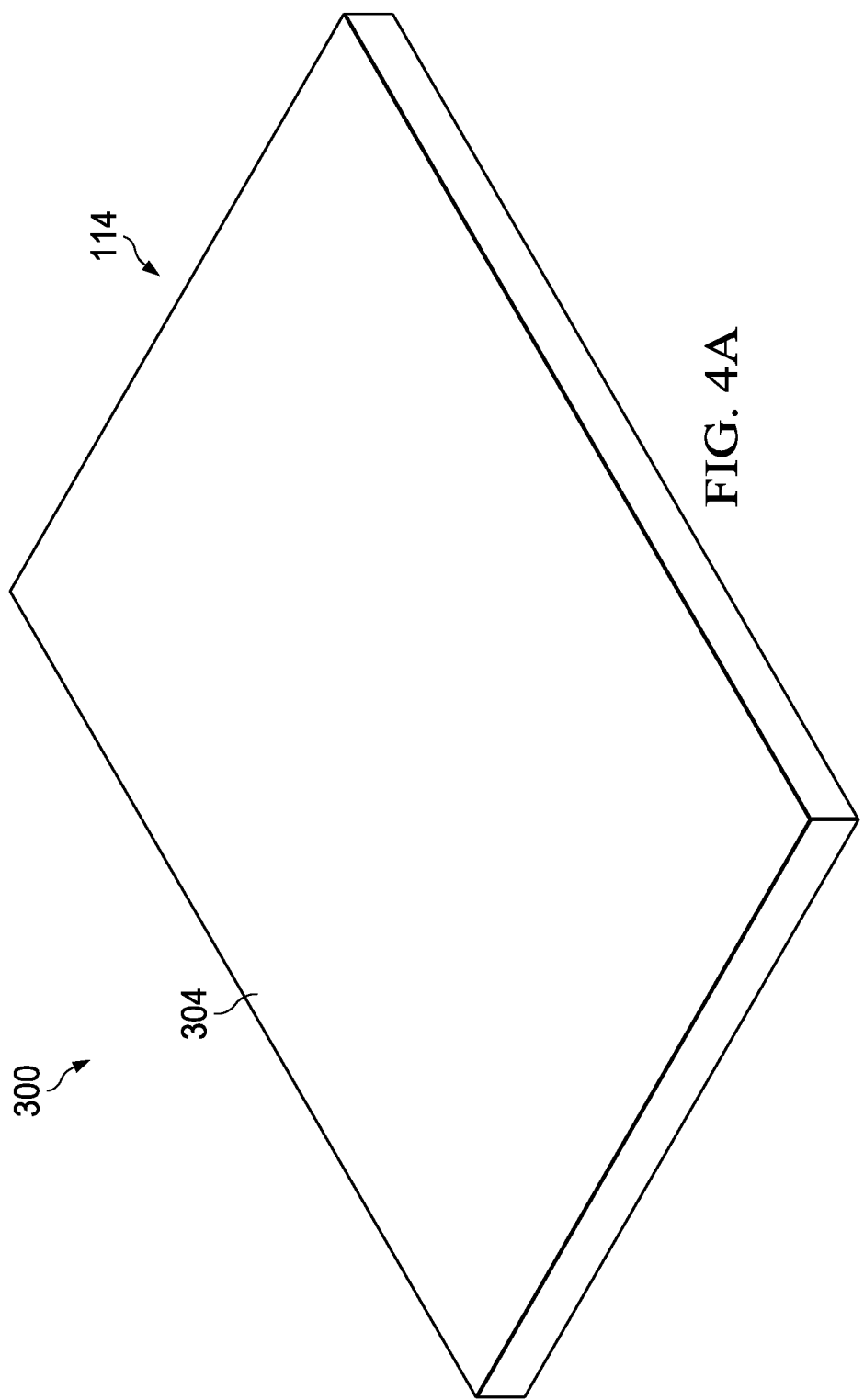
Figure 4B:
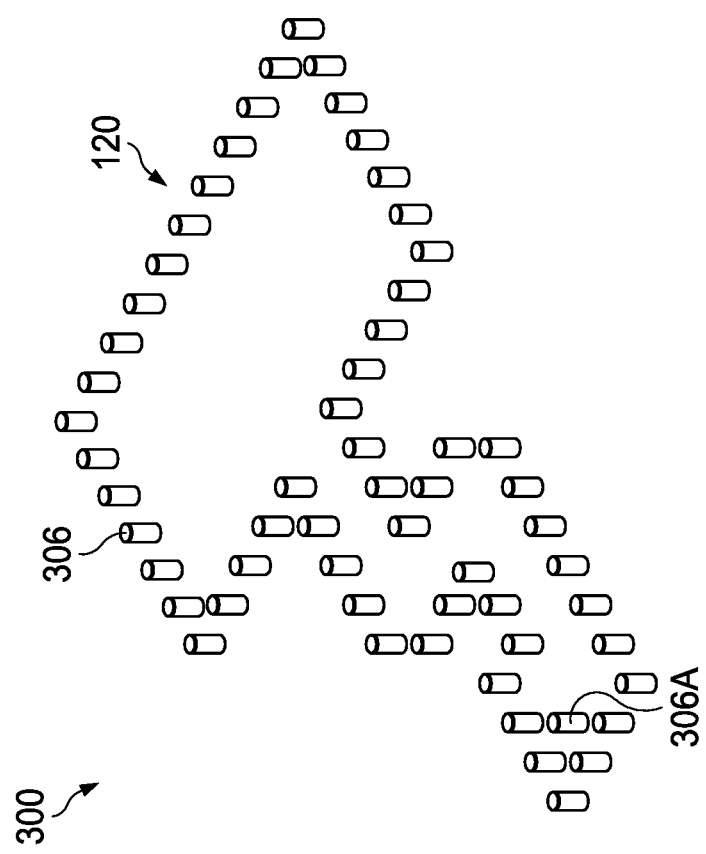
Figure 4C:
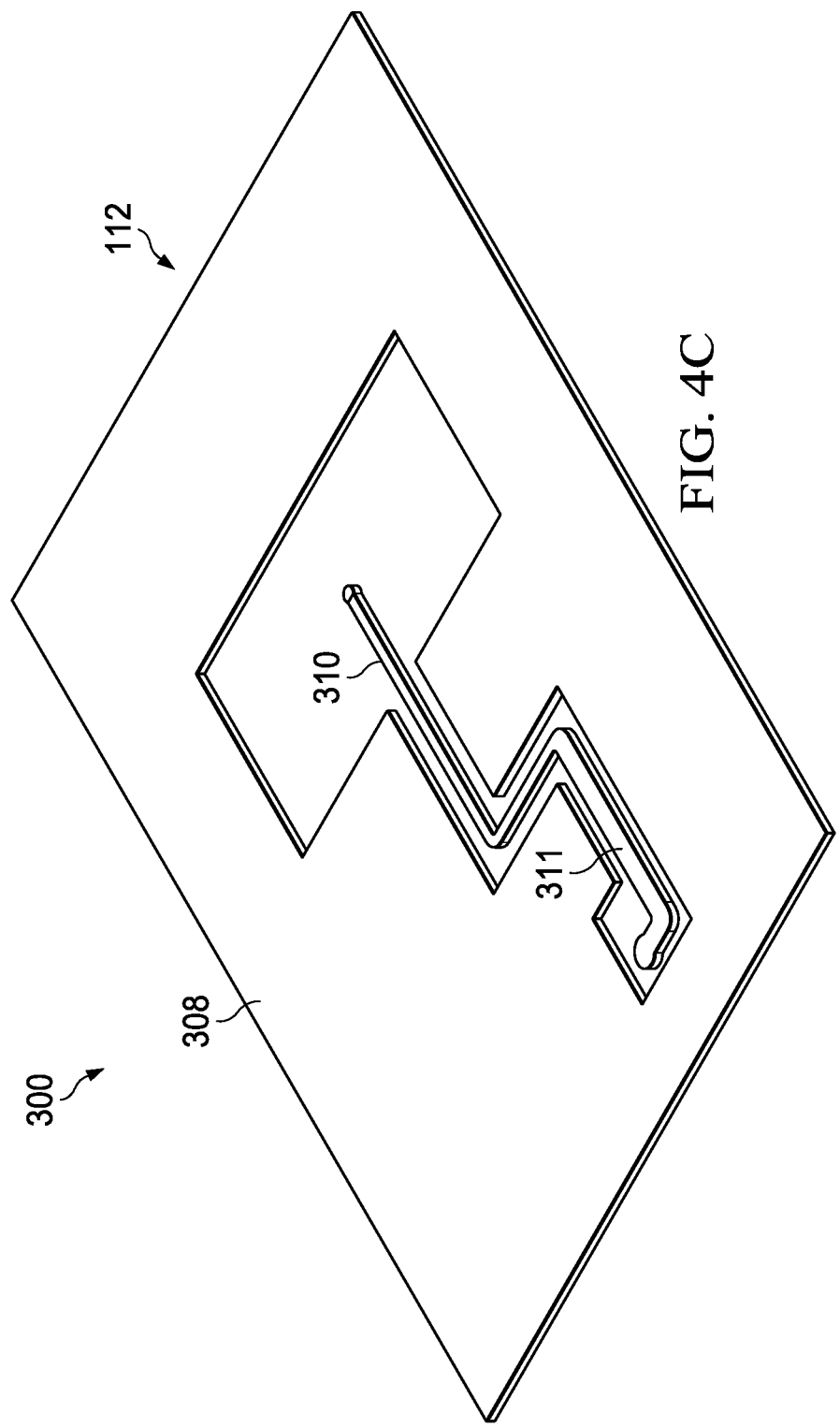
Figure 4E:
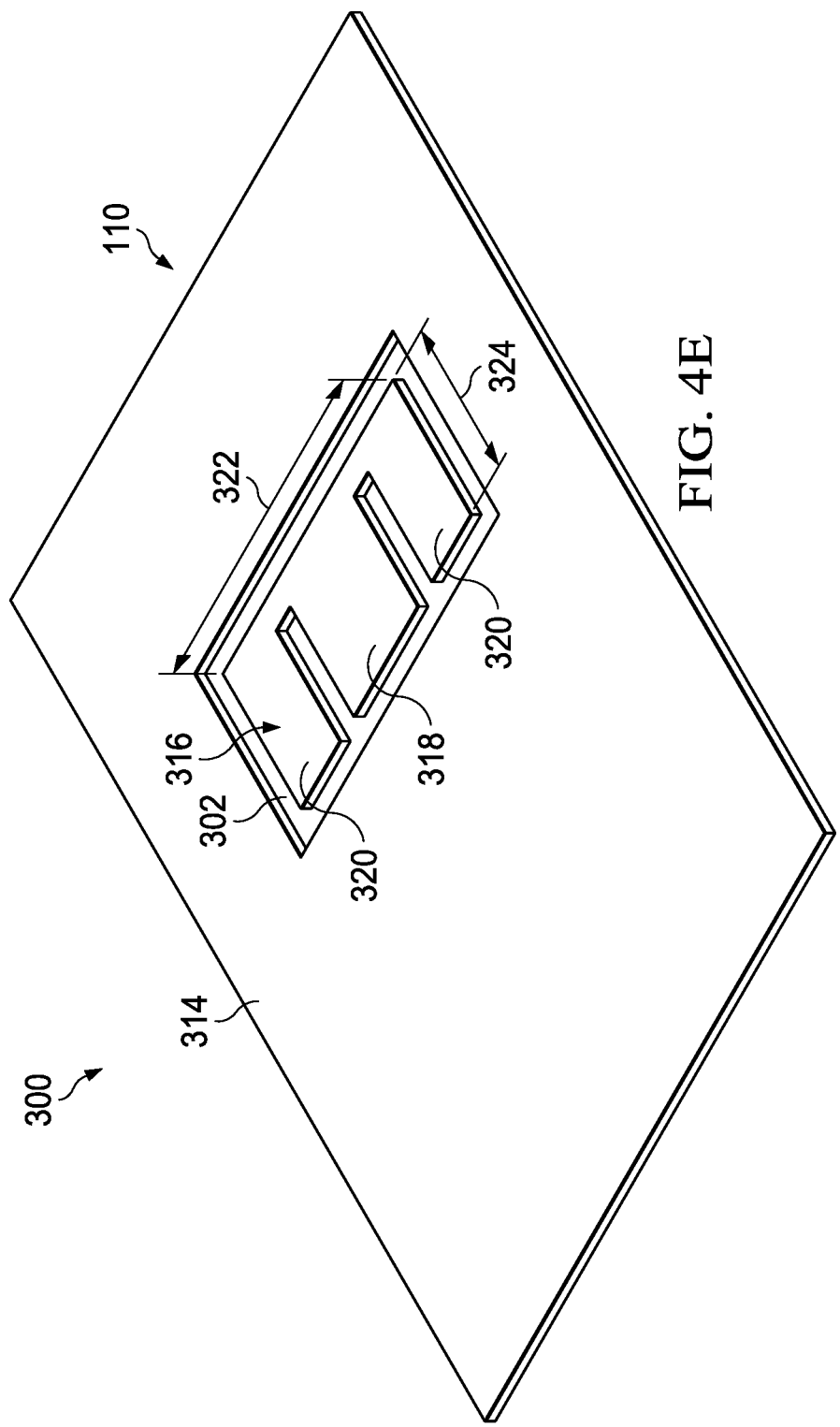

Examples of a package-integrated antenna 302 suitable for use as one of antennas 132 and/or 134 are described with reference to FIGS. 3 and 4A-4E. FIG. 3 is a perspective view of a package 300 that includes the package-integrated antenna 302 according to some aspects of the present disclosure. FIGS. 4A-4E are perspective views of specific conductor layers of the package 300. FIG. 4A is perspective view of an M3 layer 114 of the package 300 that includes the package-integrated antenna 302 according to some aspects of the present disclosure. FIG. 4B is perspective view of a V2 layer 120 of the package 300 that includes the package-integrated antenna 302 according to some aspects of the present disclosure. FIG. 4C is perspective view of an M2 layer 112 of the package 300 that includes the package-integrated antenna 302 according to some aspects of the present disclosure. FIG. 4D is perspective view of a V1 layer 118 of the package 300 that includes the package-integrated antenna 302 according to some aspects of the present disclosure. FIG. 4E is perspective view of an M1 layer 110 of the package 300 that includes the package-integrated antenna 302 according to some aspects of the present disclosure.

The package-integrated antenna 302 may be formed by one or more layers of the package in which it is incorporated. In some examples, the package-integrated antenna 302 includes an M1 layer 110, an M2 layer 112, an M3 layer 114, a V1 layer 118, a V2 layer 120, a front-side solder resist layer 108, an intermediate dielectric layer 104, and core dielectric layer 106, each substantially as described above. In the perspective view of FIG. 3, the dielectric layers are translucent to avoid obscuring the conductive features.

Referring first to FIGS. 3 and 4A, in the M3 layer 114, the package 300 may include a first ground plane 304 of conductive material that extends underneath and beyond the antenna 302. Referring to FIGS. 3 and 4B, in the V2 layer 120, the package 300 may include one or more vias 306 that couple the first ground plane 304 to a second ground plane 308 in the M2 layer 112. The vias 306 may define sides of a cavity that lies directly underneath a patch 316 of the antenna 302. The cavity may contain dielectric material of the intervening dielectric layers (e.g., core dielectric layer 106, intermediate dielectric layer 104, etc.) while being free of any conductive features (other than possibly a transmission line 310 and via 312A coupled to the antenna 302) between the antenna patch 316 in the M1 layer 110 and the first ground plane 304 in the M3 layer. In this way, the resulting antenna 302 may be considered a cavity-backed antenna 302. This configuration may improve isolation of the antenna 302 and/or improve radiation efficiency.

Additionally, the vias 306 may define and surround a cut out for a conductive transmission line 310 in the M2 layer 112. The V2 layer 120 may also include one or more vias 306A that couple the transmission line 310 to lower layers and to a bond pad 128 of the die 126.

Referring to FIGS. 3 and 4C, in the M2 layer 112, the package 300 may include the second ground plane 308 that surrounds the antenna 302 but does not extend directly underneath. In this way, the M2 layer 112 further defines the cavity underneath the antenna 302.

The M2 layer 112 may also include the conductive transmission line 310 (e.g., a microstrip or stripline) that couples to the antenna 302. In the case of a transmitter antenna 132, the transmission line 310 carries a driving signal from a die 126 to the antenna 302 that causes the antenna 302 to produce an electromagnetic wave. In the case of a receiver antenna 134, the transmission line 310 carries a signal produced by the antenna 302 in response to a reflected and/or received electromagnetic wave to a die 126 that processes the signal. The second ground plane 308 in the M2 layer 112 may be cut out so as not to couple to the transmission line 310.

To minimize losses and/or to reduce signal reflection, the antenna may be impedance matched to the circuitry of the die 126. Accordingly, in some of the examples of FIG. 4C, the transmission line 310 includes one or more portions 311 with varying trace width to tune the impedance. In some such examples, the transmission line 310 includes a quarter-wave stub in series, such as a quarter-wave transformer stub, configured to adjust the impedance of the antenna to match the impedance of the circuitry on the die 126.

Referring to FIGS. 3 and 4D, in the V1 layer 118, the package 300 may include one or more vias 312 that couple the second ground plane 308 to a third ground plane 314 in the M1 layer 110. The vias 312 may further define the cavity underneath the antenna 302 and further define the cut out for the transmission line 310. The V1 layer 118 may also include one or more vias 312A that couple the transmission line 310 to an antenna patch in the M1 layer 110.

Referring to FIGS. 3 and 4E, in the M1 layer 110, the package 300 may include the third ground plane 314 and the patch 316 of the antenna 302. As noted above, the antenna 302 may be configured to emit and/or receive electromagnetic waves at a set of frequencies. In some examples, the antenna 302 is tuned for 78.5 GHz radar and provides at least 5 GHz of bandwidth from 76 GHz to 81 GHz. The set of frequencies may govern the shape and structure of the antennas, including the patch 316. In some examples, the patch 316 has a continuous geometric shape (e.g., a simple rectangle that extends uninterrupted from end to end), although it may also have any other suitable antenna shape. Accordingly, in some examples, the patch 316 includes a center portion 318 and side portions 320 disposed on opposite sides that are partially separated from the center portion 318 by recesses that extend partially through the patch 316 in a direction parallel to an edge of the patch 316. In some examples where the patch 316 has a width 322 in a first direction of between about 1000 µm and about 2000 µm and a length 324 in a second direction of between about 500 µm and about 1000 µm, the recesses may extend between about 400 µm and about 900 µm into the patch 316 in the second direction (e.g., about 50 µm less than the patch length 324). In such examples, the recesses may have a width in the first direction between about 50 µm and about 100 µm and may form the center portion 318 and the side portions 320 to have widths in the first direction of between about 200 µm and about 1500 µm. The widths of the center portion 318 and side portions 320 may be the same or different from one another. Of course, other configurations of the patch 316 are both contemplated and provided for.

Figure 5A:
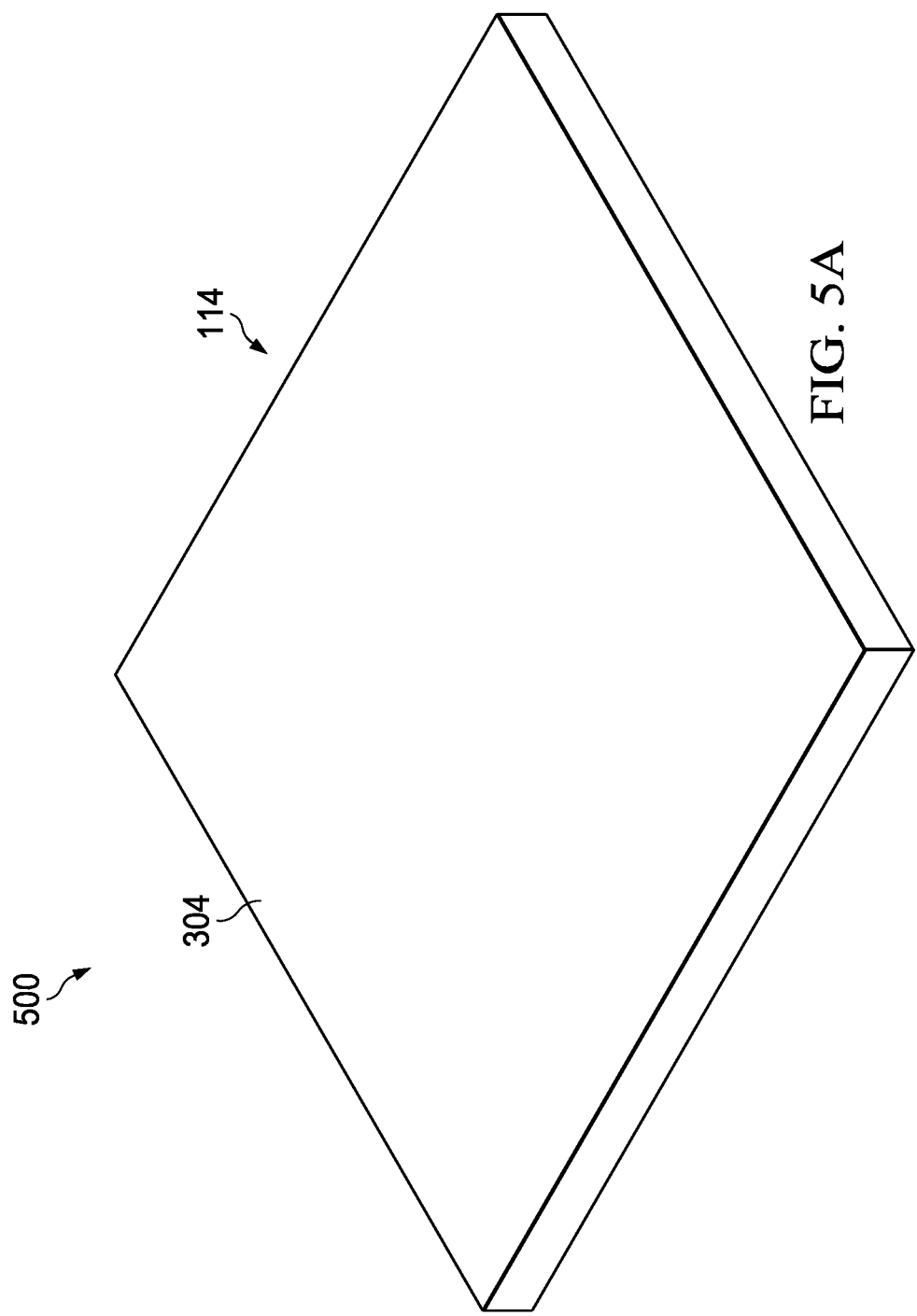
Figure 5C:
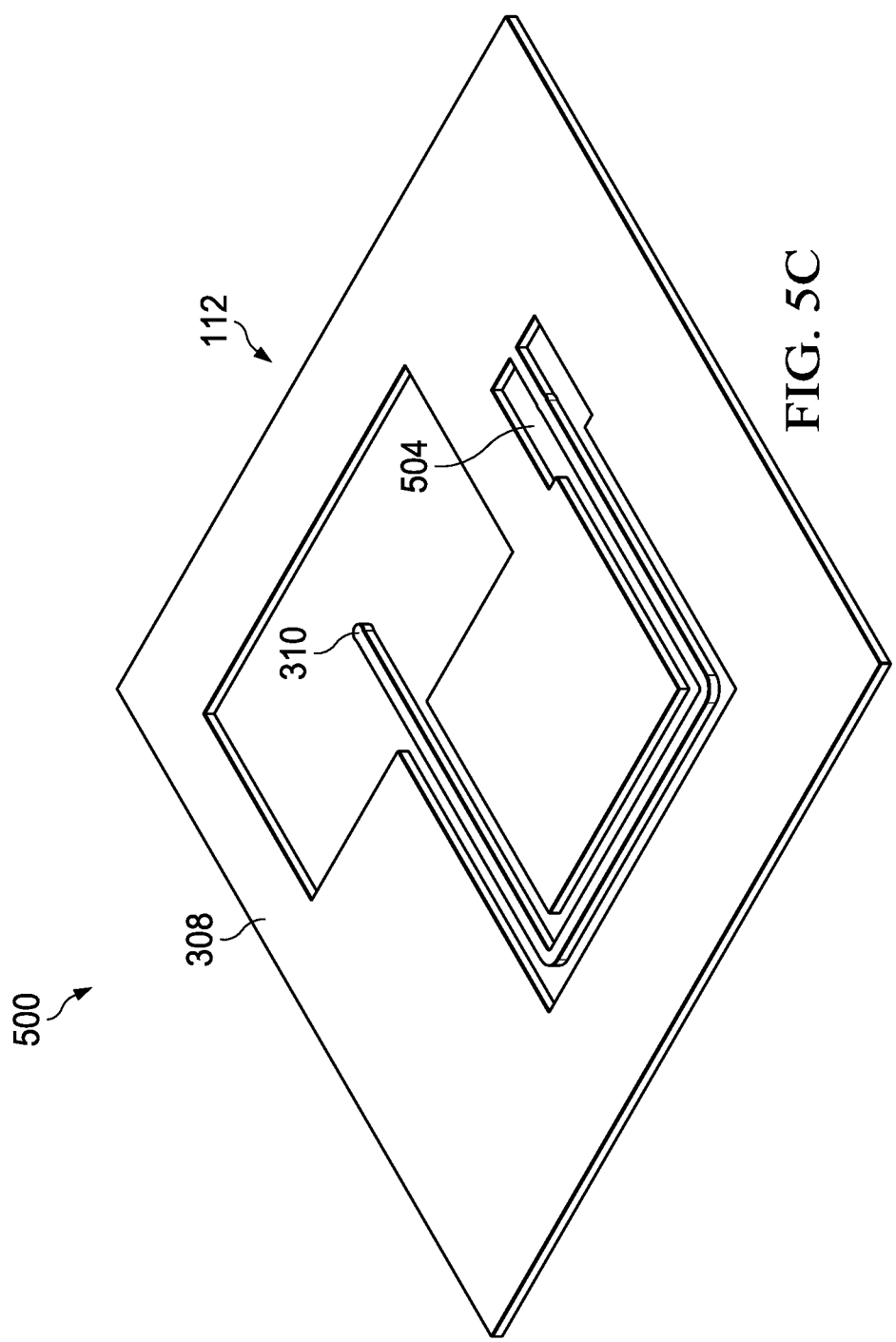
Figure 5E:
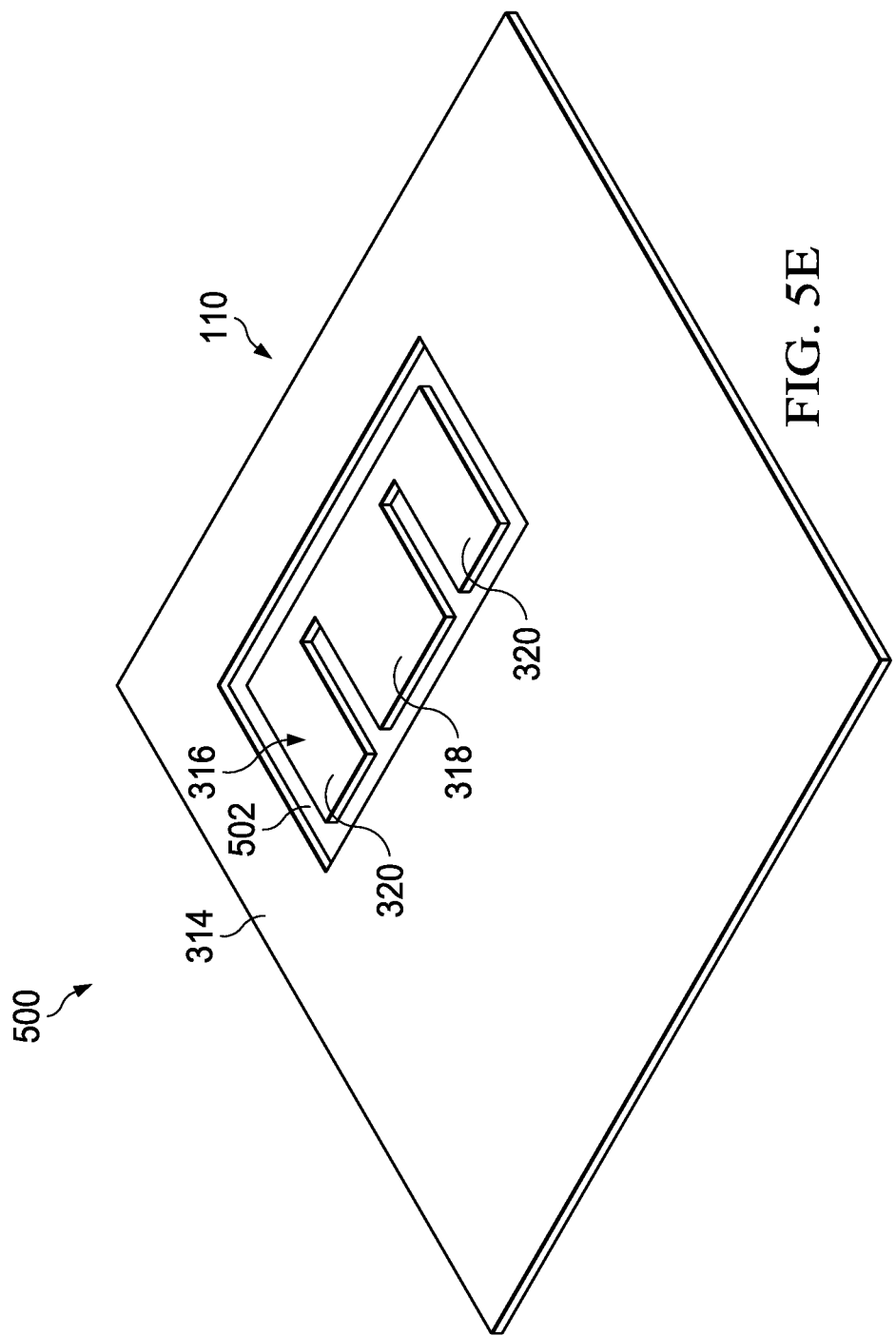

Further examples of a package-integrated antenna 502 suitable for use as one of antennas 132 and/or 134 are described with reference to FIGS. 5A-5E. FIG. 5A is perspective view of an M3 layer 114 of a package 500 that includes the package-integrated antenna 502 according to some aspects of the present disclosure. FIG. 5B is perspective view of a V2 layer 120 of the package 500 that includes the package-integrated antenna 502 according to some aspects of the present disclosure. FIG. 5C is perspective view of an M2 layer 112 of the package 500 that includes the package-integrated antenna 502 according to some aspects of the present disclosure. FIG. 5D is perspective view of a V1 layer 118 of the package 500 that includes the package-integrated antenna 502 according to some aspects of the present disclosure. FIG. 5E is perspective view of an M1 layer 110 of the package 500 that includes the package-integrated antenna 502 according to some aspects of the present disclosure.

In many aspects, the package 500 is substantially similar to the package 300 of FIGS. 3-4E. For example, referring to FIG. 5A, the package 500 may include a first ground plane 304 of conductive material in the M3 layer 114 that extends directly underneath and beyond the antenna 502. Referring to FIG. 5B, in the V2 layer 120, the package 500 may include one or more vias 306 that couple the first ground plane 304 to a second ground plane 308 in the M2 layer 112. The vias 306 may define a cavity directly underneath the antenna 502. The V2 layer 120 may also include one or more vias 306A that couple the transmission line 310 to lower layers and to a bond pad 128 of the die 126.

Referring to FIG. 5C, in the M2 layer 112, the package 500 may include the second ground plane 308 that surrounds the antenna 502 but does not extend directly underneath. In this way, the M2 layer 112 further defines the cavity underneath the antenna 502.

The M2 layer 112 may also include the conductive transmission line 310 that couples to the antenna 502. To minimize losses and/or signal reflection, the antenna 502 may be impedance matched to the circuitry of the die 126. Accordingly, in some of the examples of FIG. 5C, the transmission line 310 includes one or more short-circuited or open-circuited stubs 504 to adjust the impedance of the antenna to match the impedance of circuitry on the die 126.

Referring to FIG. 5D, in the V1 layer 118, the package 500 may include one or more vias 312 that couple the second ground plane 308 to a third ground plane 314 in the M1 layer 110. The V1 layer 118 may also include one or more vias 312A that couple the transmission line 310 to an antenna patch in the M1 layer 110.

Referring to FIG. 5E, in the M1 layer 110, the package 500 may include the third ground plane 314 and the patch 316 of the antenna 502. The patch 316 may be substantially similar to that described above and may be configured to emit and/or receive electromagnetic waves at a set of frequencies. In some examples, the patch 316 includes a center portion 318 and side portions 320 disposed on opposite sides that are partially separated from the center portion 318 by recesses that extend partially through the patch 316 in a direction parallel to an edge of the patch 316.

The antennas of FIGS. 3-5E are merely some examples of suitable antennas, and the package may incorporate other suitable antenna structures both additionally and in the alternative.

Figure 6:
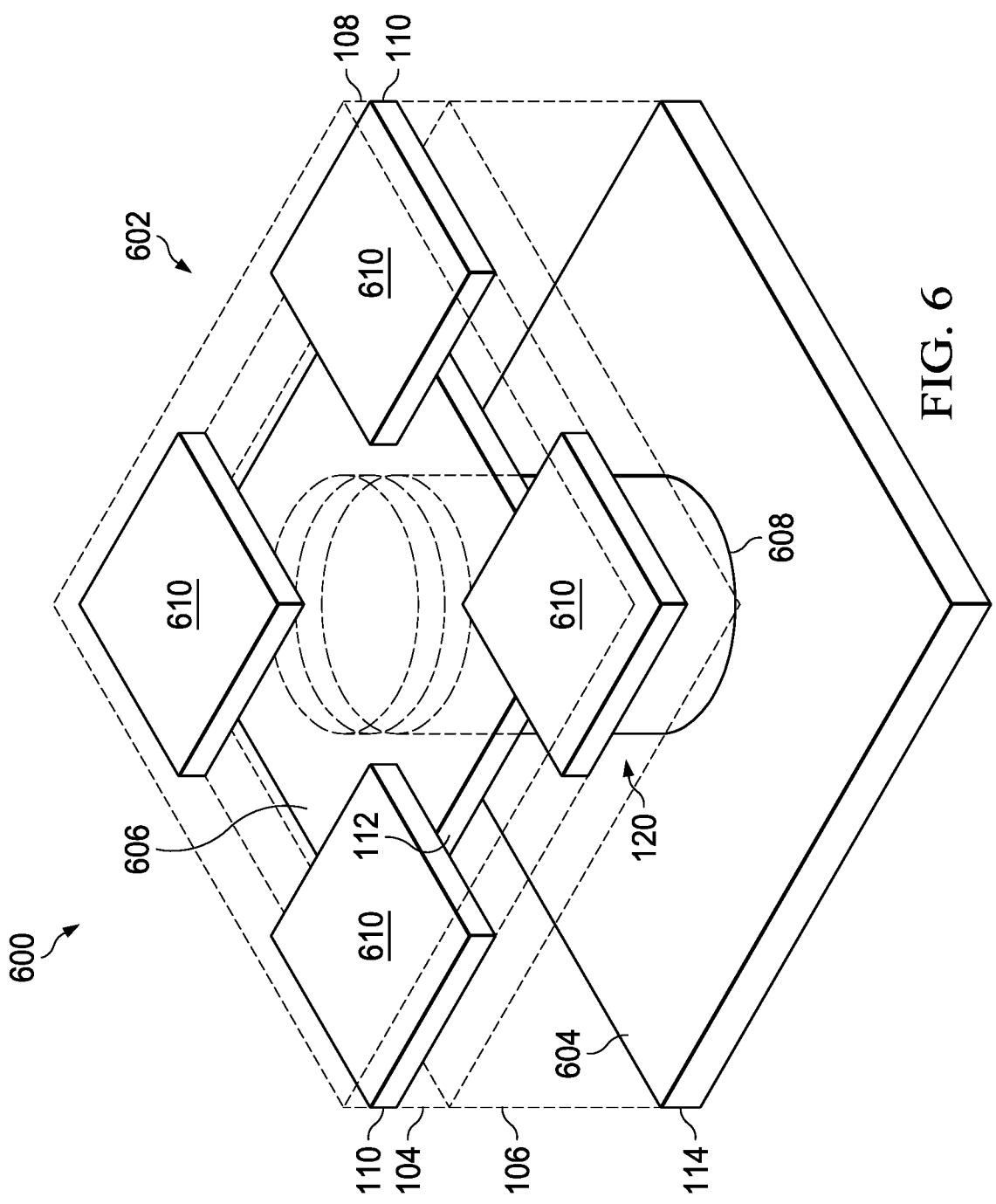
FIG. 6 is a perspective view of a package that includes an electromagnetic band gap cell according to some aspects of the present disclosure.

As shown in FIG. 2, the AOP package 100 may include an EBG structure 142 disposed between the transmitter antennas 132 and the receiver antennas 134. The EBG structure 142 may include any number of repeating EBG cells disposed in direct contact with one another. Examples of an EBG cell 602 suitable for use in the EBG structure 142 are described with reference to FIG. 6. FIG. 6 is a perspective view of a package 600 that includes the EBG cell 602 according to some aspects of the present disclosure. Adjacent EBG cells 602 align along the dashed boundary.

The EBG cell size depends on the frequency or frequency range that the EBG cell 602 is intended to dampen. In some examples, it is a square cell with a length and a width between about 200 µm to 300 µm to dampen 76 GHz to 81 GHz waves.

Similar to a package-integrated antenna, the EBG cell 602 may be formed from one or more layers of the package in which it is incorporated. In some examples, the EBG cell 602 includes features of an M1 layer 110, an M2 layer 112, an M3 layer 114, a V2 layer 120, a front-side solder resist layer 108, an intermediate dielectric layer 104, and a core dielectric layer 106, each substantially as described above. For clarity, the dielectric layers are transparent to show the underlying conductor layers.

In the M3 layer 114, the EBG cell 602 may include a bottom conductive feature 604 that extends along an entirety of the EBG cell 602. When the EBG cell 602 is disposed next to another EBG cell 602 in an EBG structure 142, the bottom conductive feature 604 may couple across EBG cells 602 so that the combined bottom conductive feature 604 extends along the entirety of the EBG structure 142. In particular, the combined bottom conductive features 604 may extend past the EBG structure 142 to couple to the first ground plane 304 underneath the antenna(s) 302.

In the M2 layer 112, the EBG cell 602 may include an intermediate conductive feature 606. The intermediate conductive feature 606 may have any suitable shape depending on the frequency or frequency range that the EBG cell 602 is intended to dampen. In some examples, the intermediate conductive feature 606 is a rectangular prism with a length that is between about 150 µm and about 250 µm and a width that is between about 150 µm and about 250 µm. The intermediate conductive feature 606 may be sized such that an intermediate conductive feature 606 of an EBG cell 602 and an intermediate conductive feature 606 of an adjacent EBG cell 602 are separated by a gap that is between about 40 µm and about 80 µm.

In the V2 layer 120, the EBG cell 602 may include a via 608 that couples the bottom conductive feature 604 to the intermediate conductive feature 606.

In the M1 layer 110, the EBG cell 602 may include a set of top conductive features 610. As with the intermediate conductive feature 606, the top conductive features 610 may have any suitable shape depending on the frequency or frequency range that the EBG cell 602 is intended to dampen. In some examples, the top conductive features 610 are rectangular prisms each with a length that is between about 150 µm and about 250 µm and a width that is between about 150 µm and about 250 µm. The top conductive features 610 may be arranged at the periphery of the EBG cell 602 such that when the EBG cell 602 is disposed next to another EBG cell 602 in an EBG structure 142, the top conductive features 610 may couple across EBG cells 602. In this regard, a combined top conductive feature 610 may be up to 4× the size (twice the length and twice the width) of a top conductive feature 610 of any one EBG cell 602.

In some examples, no vias extend between the intermediate conductive feature 606 and the top conductive features 610, and thus, the top conductive features 610 are capacitively coupled to the intermediate conductive feature 606. In that regard, the top conductive features 610 may be conductively isolated from a remainder of the package 600.

Of course, these are merely some examples of an EBG cell 602 and other suitable EBG cells 602 are both contemplated and provided for.

Figure 7:
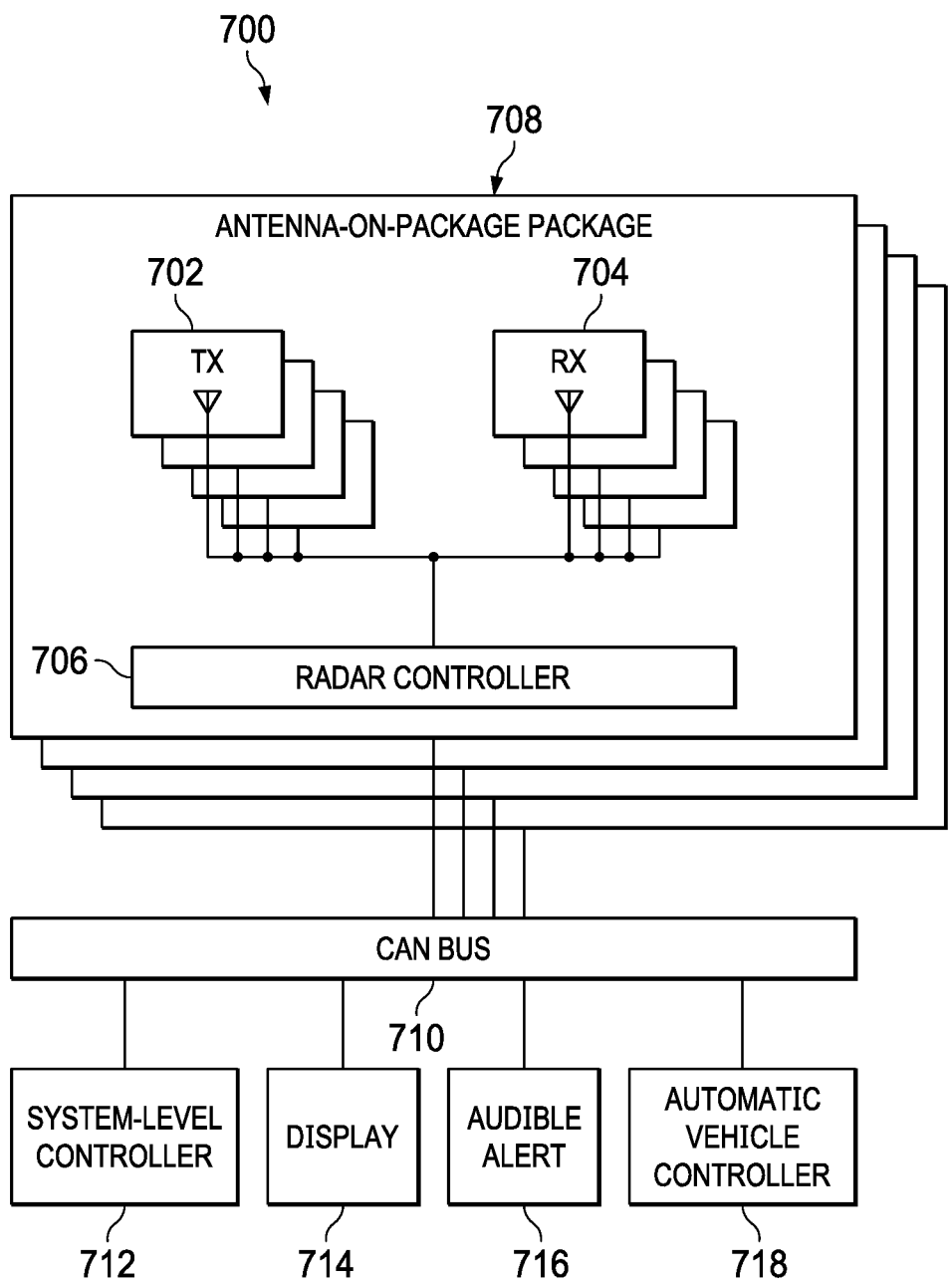
FIG. 7 is a block diagram of a vehicle radar system according to some aspects of the present disclosure.

An example of a system 700 in which the AOP integrated circuit packages 100, 300, 500, and/or 600 may be used is described with reference to FIG. 7. In that regard, FIG. 7 is a block diagram of a vehicle radar system 700 according to some aspects of the present disclosure.

The system 700 includes a set of transmitter antennas 702, a set of receiver antennas 704, and a radar controller 706. The transmitter antennas 702 may be substantially similar to transmitter antennas 132 above, and the receiver antennas 704 may be substantially similar to the receiver antennas 134 above. Accordingly, the set of transmitter antennas 702 and the set of receiver antennas 704 may be physically incorporated into an AOP integrated circuit package 708 substantially similar to circuit packages 100, 300, 500, and/or 600, above. In turn, the radar controller 706 may be housed in one or more dies, such as the die 126 above, and physically incorporated into the AOP integrated circuit package 708.

The system 700 may be incorporated into an automobile or other vehicle by deploying any number of instances of the integrated circuit package 708 around the perimeter to detect other vehicles, within the interior to detect passengers, and/or in any other suitable location throughout the vehicle. In some examples, the system 700 includes as many as 30 or more integrated circuit packages 708 deployed throughout the vehicle for collision avoidance.

The system 700 further includes a Controller Area Network (CAN) bus 710 that communicatively couples the integrated circuit packages 708 to one or more of a system-level controller 712, a display 714, an audible alert device 716, and/or an automatic vehicle steering controller 718.

In operation, the radar controller 706 generates a radar signal and one or more of the transmitter antennas 702 radiate a corresponding electromagnetic wave. Objects within the surrounding environment may reflect the electromagnetic wave causing a reflected echo to be received by one or more of the receiver antennas 704. The radar controller 706 may receive the corresponding radar signal from the receiver antennas 704 and may process the signal. The radar controller 706 may then transmit digital information regarding the radar signal or the radar return over the CAN bus 710.

The system-level controller 712 receives the information from the CAN bus 710, and processes the information. In some examples, the system-level controller 712 processes the information to determine whether a collision is impending. If so, the system-level controller 712 may send a warning or notification that causes the display 714 and/or to the audible alert device 716 to alert the driver. Additionally or in the alternative, the system-level controller 712 may send a command to the automatic vehicle steering controller 718 to take action to avoid the collision, such as steering or breaking. Such collision avoidance steering commands may be conditioned on the system-level controller 712 determining, based on inputs from other AOP integrated circuit packages 708, that steering away from the impending collision would not steer into a different collision situation.

It is understood that the integrated circuit packages described herein may advantageously be used in other systems and designs, unrelated to automobile radars. In that regard, while an automobile radar MMIC is an example of the present disclosure, it is understood that application of these teachings to other non-automotive and non-radar applications is consistent with and contemplated by the present disclosure.

What is claimed is:

1. An integrated circuit package comprising:
   a plurality of dielectric layers;
   an integrated circuit die disposed on a first side of the plurality of dielectric layers; and
   a plurality of conductor layers interspersed with the plurality of dielectric layers, wherein:
      the plurality of conductor layers includes a first layer disposed on a second side of the plurality of dielectric layers opposite the first side; and
   the first layer includes antennas electrically coupled to the integrated circuit die, wherein:
      the antennas include a plurality of transmitter antennas aligned in a first direction and a plurality of receiver antennas aligned in a second direction that is perpendicular to the first direction;
      the first direction is at an angle of about 45° relative to side surfaces of the plurality of transmitter antennas; and
      the second direction is at an angle of about 45° relative to side surfaces of the plurality of receiver antennas.

2. The integrated circuit package of claim 1, wherein the antennas include a first antenna having:
   a center portion;
   a first side portion partially separated from the center portion by a first recess; and
   a second side portion partially separated from the center portion by a second recess.

3. The integrated circuit package of claim 1, wherein each of the antennas is cavity-backed.

4. The integrated circuit package of claim 1, further comprising an electromagnetic band gap structure disposed between the plurality of transmitter antennas and the plurality of receiver antennas.

5. The integrated circuit package of claim 4, wherein the electromagnetic band gap structure includes a plurality of isolated features of the first layer.

6. The integrated circuit package of claim 1 further comprising a plurality of package connectors disposed on the first side of the plurality of dielectric layers and are electrically coupled to the integrated circuit die.

7. The integrated circuit package of claim 1, wherein:
   the first layer includes a first ground plane disposed around a first antenna of the antennas;
   the plurality of conductor layers includes a second layer disposed below the first layer and a via layer disposed between the second layer and the first layer;
   the second layer includes a second ground plane disposed below and extending beyond the first antenna; and
   the via layer includes a plurality of vias that couple the first ground plane to the second ground plane and that is disposed around a perimeter of the first antenna to define a cavity between the first antenna and the second ground plane.

8. The integrated circuit package of claim 7, wherein the cavity includes a dielectric material extending between the first antenna and the second ground plane.

9. The integrated circuit package of claim 7, wherein:
   the second layer further includes a transmission line disposed such that the second ground plane is disposed around the transmission line; and
   the plurality of vias is further disposed around a perimeter of the transmission line.

10. The integrated circuit package of claim 9, wherein the via layer further includes a via that couples the transmission line to the first antenna.

11. The integrated circuit package of claim 7, wherein:
    the via layer is a first via layer;
    the plurality of vias is a first plurality of vias;
    the plurality of conductor layers includes a third layer disposed below the second layer and a second via layer disposed between the second layer and the third layer;
    the third layer includes a third ground plane disposed below and extending beyond the first antenna; and
    the second via layer includes a second plurality of vias that couple the second ground plane to the third ground plane and that is disposed directly below the first plurality of vias.

12. An integrated circuit package comprising:
    a plurality of dielectric layers;
    an integrated circuit die disposed on a first side of the plurality of dielectric layers; and
    a plurality of conductor layers interspersed with the plurality of dielectric layers, wherein:
       the plurality of conductor layers includes a first layer disposed on a second side of the plurality of dielectric layers opposite the first side;
       the first layer includes antennas electrically coupled to the integrated circuit die;
       the antennas include a plurality of transmitter antennas aligned in a first direction and a plurality of receiver antennas aligned in a second direction that is perpendicular to the first direction;
       the antennas are configured to produce an electromagnetic wave at a center frequency;
       the plurality of transmitter antennas are arranged at a pitch that is about half a wavelength of the electromagnetic wave; and
       the plurality of receiver antennas are arranged at the pitch that is about half the wavelength of the electromagnetic wave.

13. An integrated circuit package comprising:
    an integrated circuit die; and
    a first conductor layer disposed on the integrated circuit die that includes antennas, wherein each of the antennas includes:
       a center portion;
       a first side portion adjacent the center portion;
       a first recess extending partially through the respective antenna between the center portion and the first side portion;
       a second side portion adjacent the center portion; and
       a second recess extending partially through the respective antenna between the center portion and the second side portion;

wherein the antennas include:
- a plurality of transmitter antennas aligned in a first direction that is at an angle of about 45° relative to side surfaces of the plurality of transmitter antennas; and
- a plurality of receiver antennas aligned in a second direction that is perpendicular to the first direction and is at an angle of about 45° relative to side surfaces of the plurality of receiver antennas.

14. The integrated circuit package of claim 13, wherein the first conductor layer further includes a first ground plane disposed around the antennas.

15. The integrated circuit package of claim 14 further comprising a second conductor layer disposed between the first conductor layer and the integrated circuit die, wherein:
- the second conductor layer includes a second ground plane directly underneath the first ground plane that is coupled to the first ground plane; and
- a region directly underneath each of the antennas is free of the second conductor layer.

16. The integrated circuit package of claim 15, wherein the second conductor layer further includes a transmission line that electrically couples a first antenna of the antennas to the integrated circuit die.

17. The integrated circuit package of claim 16, wherein the transmission line includes an impedance-matching stub.

18. An apparatus comprising:
- a plurality of dielectric layers configured to couple to an integrated circuit die on a first side of the plurality of dielectric layers;
- a plurality of connectors disposed on the first side of the plurality of dielectric layers;
- a first set of conductive features disposed within the plurality of dielectric layers and configured to electrically couple the integrated circuit die to the plurality of connectors; and
- a second set of conductive features disposed within the plurality of dielectric layers that includes a plurality of radar antennas configured to electrically couple to the integrated circuit die, wherein the plurality of radar antennas includes:
  - a plurality of transmitter antennas aligned in a first direction that is about 45° relative to side surfaces of the plurality of transmitter antennas; and
  - a plurality of receiver antennas aligned in a second direction that is perpendicular to the first direction and that is about 45° relative to side surfaces of the plurality of receiver antennas.

19. The apparatus of claim 18, wherein each antenna of the plurality of radar antennas is cavity-backed.

20. The apparatus of claim 18, further comprising an electromagnetic band gap structure disposed between the plurality of transmitter antennas and the plurality of receiver antennas.

* * * * *